United States Patent
Chen (10) Patent No.: US 7,312,989 B2
(45) Date of Patent: Dec. 25, 2007

(54) COOLER

(75) Inventor: Feng-Ming Chen, Taipei (TW)

(73) Assignee: Chenbro Micom Co., Ltd., Taipei Hsien (TW)

( * ) Notice: Subject to any disclaimer, the term of this patent is extended or adjusted under 35 U.S.C. 154(b) by 367 days.

(21) Appl. No.: 10/904,922

(22) Filed: Dec. 6, 2004

(65) Prior Publication Data

US 2006/0120041 A1  Jun. 8, 2006

(51) Int. Cl.
*H05K 7/20* (2006.01)
*H05K 5/00* (2006.01)

(52) U.S. Cl. ...................................... 361/695; 454/184

(58) Field of Classification Search ........ 361/694–695; 454/184
See application file for complete search history.

(56) References Cited

U.S. PATENT DOCUMENTS

| | | | | |
|---|---|---|---|---|
| 6,031,719 | A * | 2/2000 | Schmitt et al. | 361/695 |
| 6,115,250 | A * | 9/2000 | Schmitt | 361/695 |
| 6,322,042 | B1 * | 11/2001 | Nemec | 248/694 |
| 6,556,437 | B1 * | 4/2003 | Hardin | 361/687 |
| 6,603,661 | B2 * | 8/2003 | Smith et al. | 361/695 |
| 6,628,518 | B2 * | 9/2003 | Behl et al. | 361/687 |
| 6,839,233 | B2 * | 1/2005 | Cravens et al. | 361/695 |
| 6,961,248 | B2 * | 11/2005 | Vincent et al. | 361/796 |

\* cited by examiner

*Primary Examiner*—Greg Thompson (57) ABSTRACT

A cooler for use in a computer or server is disclosed to include a holder frame, which has a plurality of wind holes and a rail extended along one long side of the flat elongated frame base thereof, and a fan module, which includes a rack with a sliding groove coupled to the holder frame and movable along the rail to one of a series of positions corresponding to the wind holes, a fan, and a locating frame holding the fan and insertable into the rack.

10 Claims, 8 Drawing Sheets

COOLER

BACKGROUND OF THE INVENTION

1. Field of the Invention

The present invention relates to a cooling apparatus for use in a personal computer, server, or industrial host computer and more particularly, to such a cooler that allows the user to adjust the position of the fan module conveniently after installation in the mainframe of a personal computer, server, or industrial host computer.

2. Description of the Related Art

Figure 8:
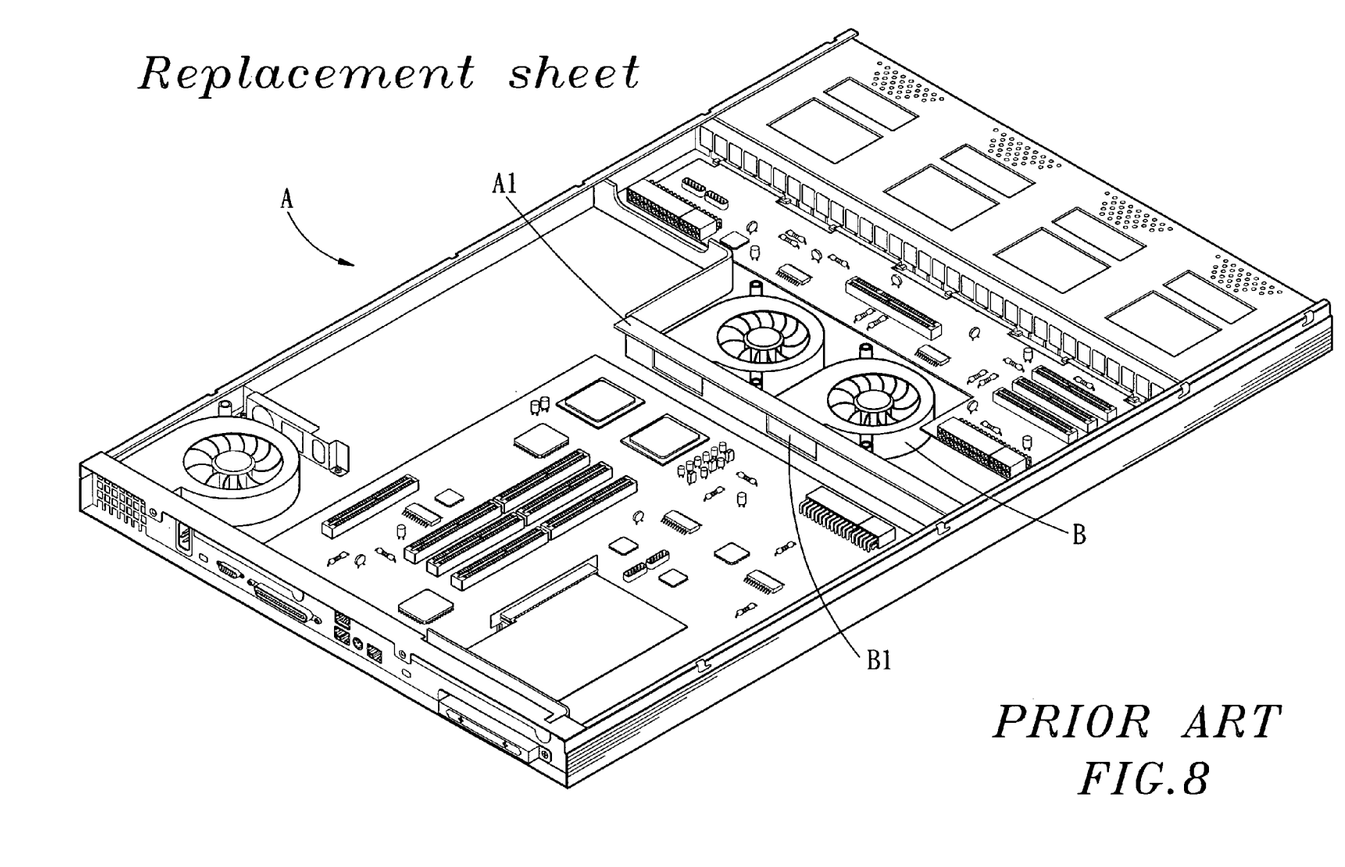
FIG. 8 illustrates a prior art cooler installed in the mainframe of a server.

Following fast development of high technology, lighter, thinner, shorter and smaller are becoming the key words for electronic instruments, including personal computers. Electronic instruments of new generation use sophisticated semiconductor chips or devices that release heat during operation. For example, an advanced personal computer uses a sophisticated CPU (Central Processing Unit) and GPU (Graphics Processing Unit) for processing any of a variety of data. These electronic devices release much heat during operation. The amount of heat energy released by these electronic devices during operation may be relatively increased subject to their operation speed. The working temperature of a CPU is normally at about 60~95° C. In order to keep normal working of the CPU, GPU and other heat-releasing electronic devices in a computer or electronic apparatus, heat must be quickly carried away. Various coolers have been disclosed for use in computers and electronic apparatus to dissipate heat. FIG. 8 shows a prior art cooler used in a server's mainframe A. According to this design, the cooler comprises a frame bar A1 transversely mounted in side of the mainframe A, and a plurality of centrifugal type turbofans B installed in the frame bar A1. Each centrifugal type turbofan B has an exhaust hole B1 for output of a turbulent flow of air toward a specific electronic component part inside the mainframe A. This design of cooler is still not satisfactory in function. Because the centrifugal type turbofans B are affixed to the frame bar A1 at predetermined locations and because different models of electronic devices (CPU, chip, interface card or hard disk drive) have different arrangement and specifications, the exhaust hole B1 may be not accurately aimed at the respective heat source, thereby lowering the heat dissipation efficiency. Further, during operation of the centrifugal type turbofans B, produced currents of air may carry heat energy away from one electronic component part to other area inside the mainframe and heat energy may be accumulated in one corner inside the mainframe around other electronic component parts, causing the electronic apparatus unable to function normally. Further, because there are many component parts inside the mainframe A around the frame bar A1, it is difficult to mount/dismount the centrifugal type turbofans B with a hand tool, complicating the cleaning or repair work of the centrifugal type turbofans B.

SUMMARY OF THE INVENTION

The present invention has been accomplished under the circumstances in view. According to one aspect of the present invention, the cooler is comprised of a holder frame and at least one fan module detachably adjustably mounted on the holder frame. The holder frame has two end flanges for quick installation in the mainframe of a personal computer, server, industrial host computer, or the like, a plurality of wind holes, and a rail extending along one long side thereof. Each fan module comprises a rack coupled to the holder frame and movable along the rail to aim the fan(s) therein at one wind hole. According to another aspect of the present invention, the rack of each fan module is modularized for mass production to hold at least one fan of any of a variety of sizes, and each fan is provided with a locating plate for easy installation in the rack and quickly removable from the rack.

DETAILED DESCRIPTION OF THE PREFERRED EMBODIMENT

Figure 1:
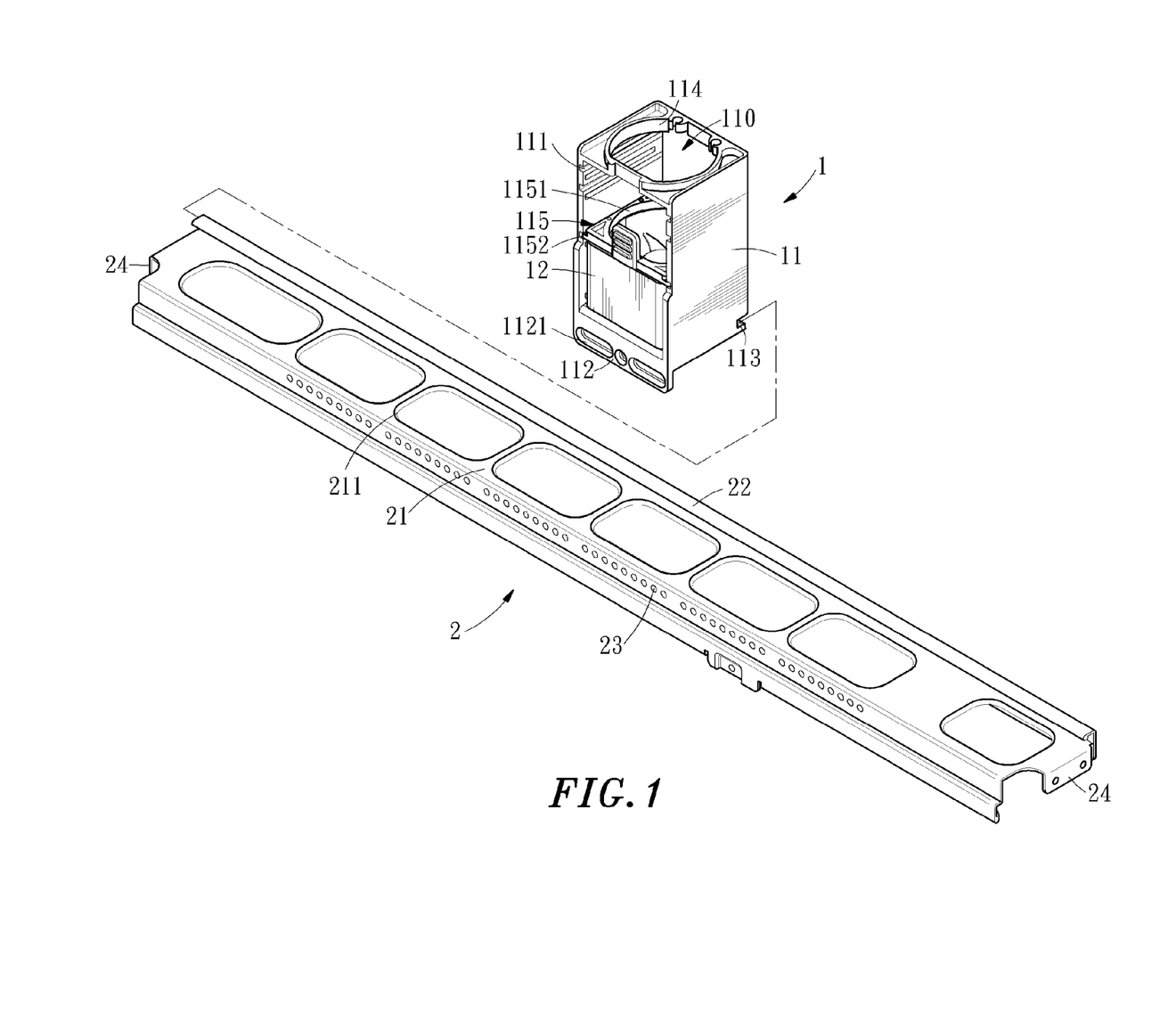
FIG. 1 is an exploded view of a cooler according to the present invention.
Figure 2:
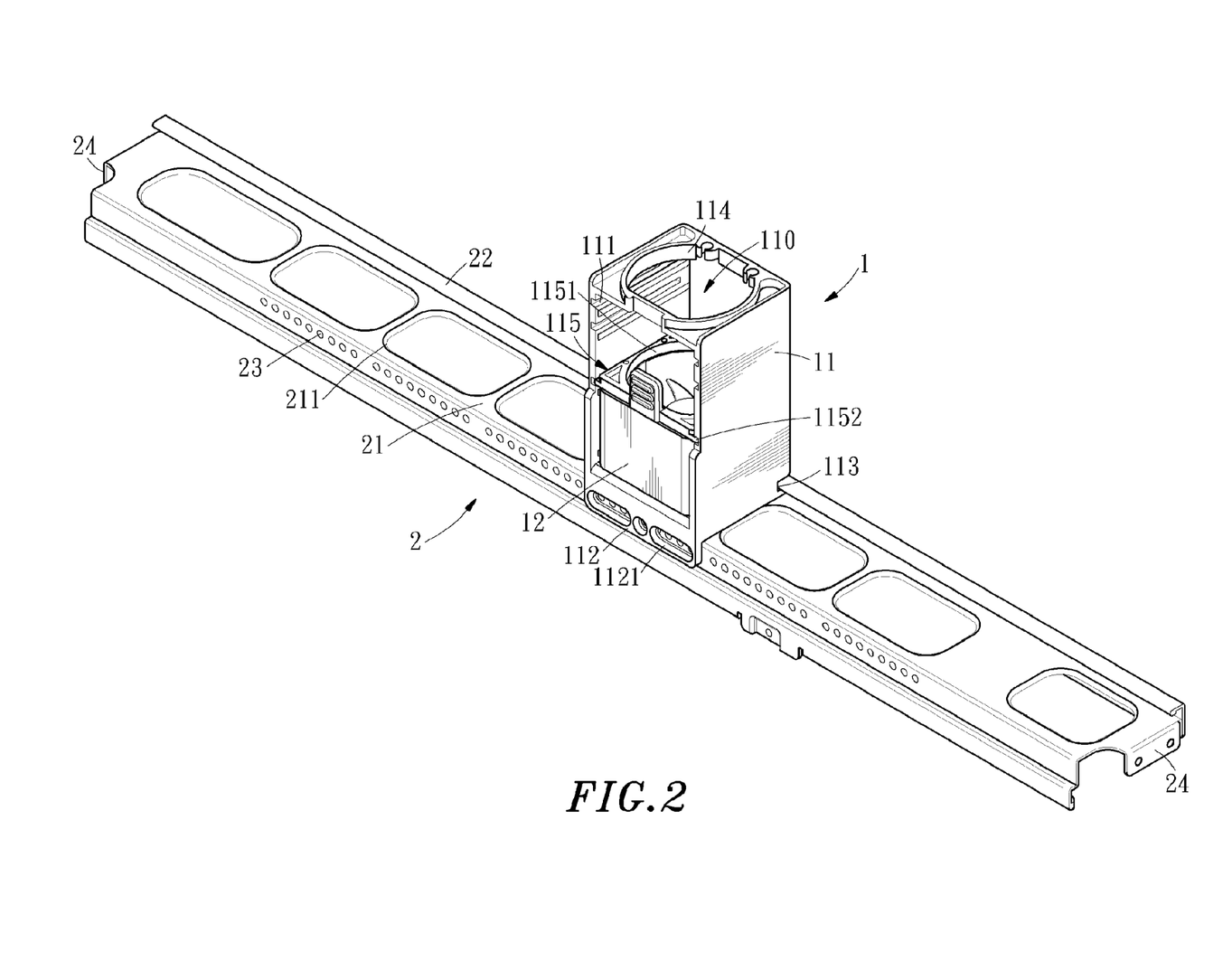
FIG. 2 is an elevational assembly view in an enlarged scale of the cooler shown in FIG. 1.
Figure 3:
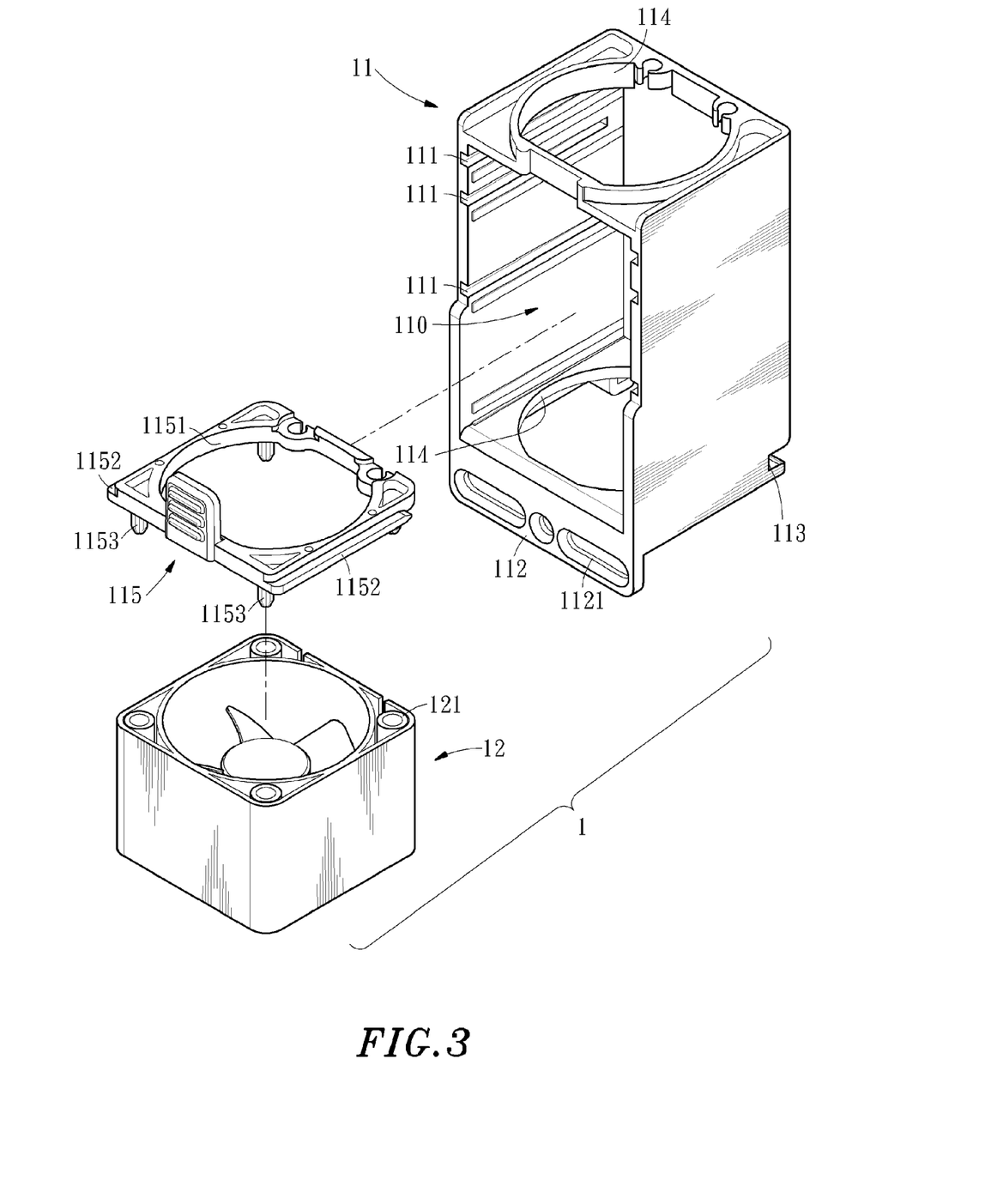
FIG. 3 is an exploded view in an enlarged scale of the fan module shown in FIG. 1.

Referring to FIGS. 1~3, a cooler is shown comprising a fan module 1 and a holder frame 2.

The fan module 1 is comprised of a rack 111 and a fan 12. The rack 111 is a hollow case member having a holding chamber 110 for accommodating the fan 12, a plurality of guiding grooves 111 symmetrically transversely provided at two sides inside the holding chamber 110, a sliding portion 112 transversely disposed at the front bottom side in flush with the front wall, a sliding groove 113 transversely formed on the back wall near the bottom side, a plurality of elongated slots 121 cut through the sliding portion 112 and horizontally aligned in a line, top and bottom openings 114 respectively formed in the top and bottom sides in air communication with the holding chamber 110, and at least one locating plate 115 detachably mounted in the holding chamber 110. The locating plate 115 comprises a center opening 1151 corresponding to the openings 114 of the rack 11, two side guiding portions 1152 symmetrically disposed at two sides and insertable into two guiding grooves 111 at same elevation in the holding chamber 110 of the rack 11, and a plurality of bottom locating rods 1153 downwardly extending from the bottom side around the border area. The fan 12 is fastened to one locating plate 115 and inserted with the locating plate 115 into the inside of the holding chamber 110 of the rack 11, having a plurality of mounting through holes 121 vertically extended through the top and bottom sides around the border area for receiving the bottom locating rods 1153 of the locating plate 115.

The holder frame 2 comprises a flat elongated frame base 21, a plurality of wind holes 211 cut through the top and bottom sides of the flat elongated frame base 21 and aligned in a line along the length of the flat elongated frame base 21, a rail 22 extended along one side, namely, the rear side of he flat elongated frame base 21 corresponding to the sliding groove 113 of the rack 11, a plurality of mounting holes 23 arranged in a line at the other side, namely, the front side of the flat elongated frame base 21, and two end flanges 24 perpendicularly downwardly suspended at the two distal ends of the flat elongated frame base 21.

During installation, the fan 12 is fastened to one locating plate 115 and then inserted with the locating plate 115 into two guiding grooves 111 at same elevation in the holding chamber 110 of the rack 11 by the guiding portions 1152 at two sides of the locating plate 115, and then the fan module 1 is placed on the flat elongated frame base 21 of the holder frame 2 to have the sliding groove 113 of the rack 11 be coupled to the rail 22 of the holder frame 2 and to have the sliding portion 112 of the rack 11 be stopped at the front side of the holder frame 2, and then the fan module 1 is moved on the flat elongated frame base 21 along the rail 22 to the desired position.

Figure 4:
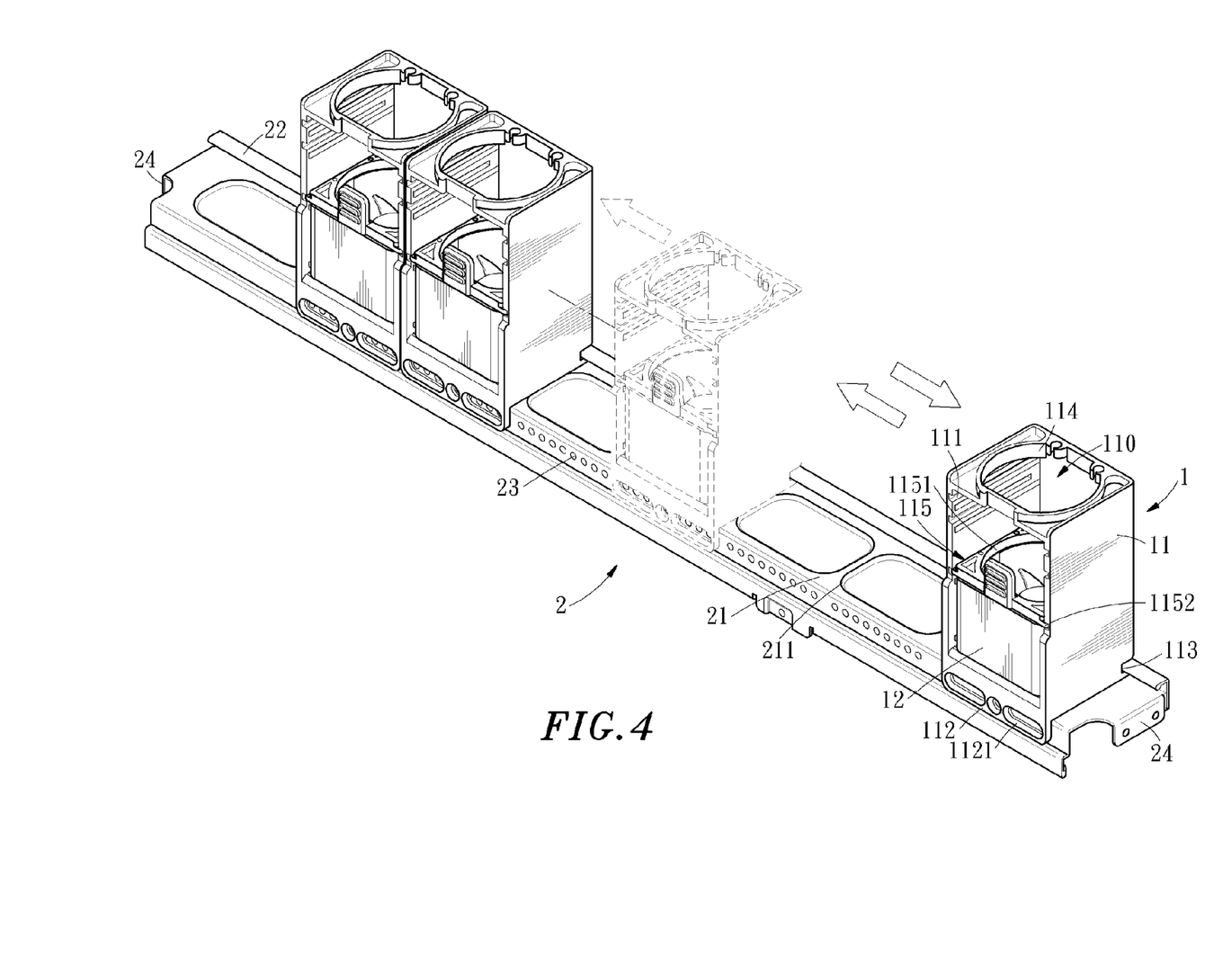
FIG. 4 is a schematic drawing showing fan modules mounted on the holder frame and moved along the rail of the holder frame according to the present invention.

Referring to FIG. 4, the fan module 1 can be moved on the flat elongated frame base 21 along the rail 22 to the desired position to have the bottom opening 114 of the rack 11 be aimed at one wind hole 211 of the holder frame 2, and then fastening members, for example, screws (not shown) are fastened to the elongated slots 1121 of the rack 11 and the respective mounting holes 23 of the holder frame 2 to affix the fan module 1 to the holder frame 2 in the desired position. During operation, currents of air from the fan 12 pass through the bottom opening 114 of the rack 11 and the respective wind hole 211 of the holder frame 2 toward the heat source to dissipate heat from the heat source. Further, a number of fan modules 1 may be installed in the holder frame 2 to enhance the heat dissipation power, preventing accumulation of heat energy at the area of other electronic parts.

Figure 5:
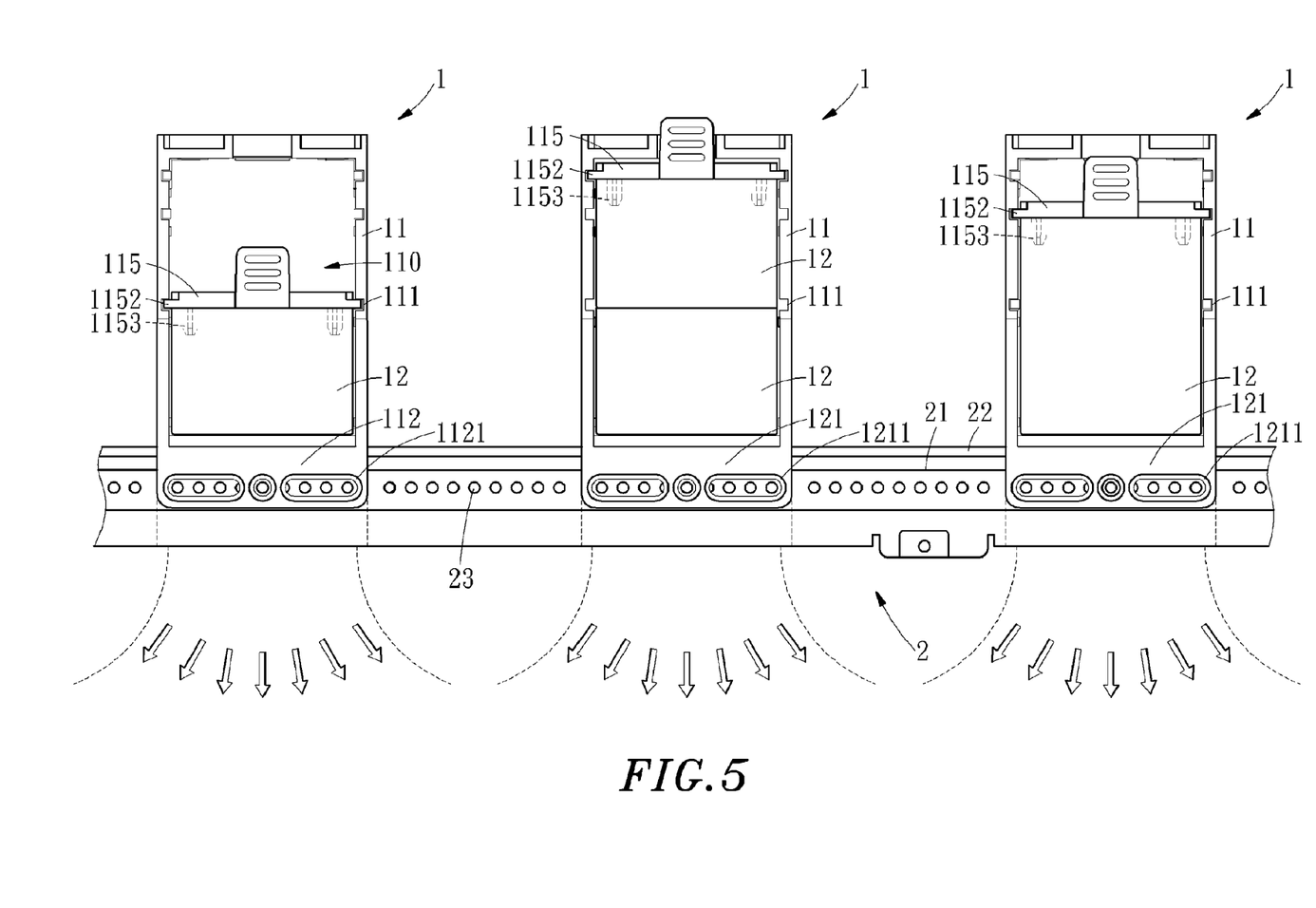
FIG. 5 is a schematic front view of the present invention, showing the flowing of currents of air from three fan modules at the holder frame.

Referring to FIG. 5, the rack 11 may accommodate a different size of fan 12; two fans 12 may be mounted together in the holding chamber 110 of the rack 1; or a number of fan modules 1 may be installed in the holder frame 2. Because the fan 12 is fastened to one locating plate 115 and then the locating plate 115 is inserted into the inside of the rack 11 to hold the fan 12 in the holding chamber 110 of the rack 11, the user can remove the locating plate 115 and the attached fan 12 from the rack 11 for cleaning or replacement. Further, when two fans 12 are mounted together in the rack 11, the fans 12 are set to cause currents of air in one direction so as to provide a fabulous amount of wind, increasing the heat dissipation power.

Figure 6:
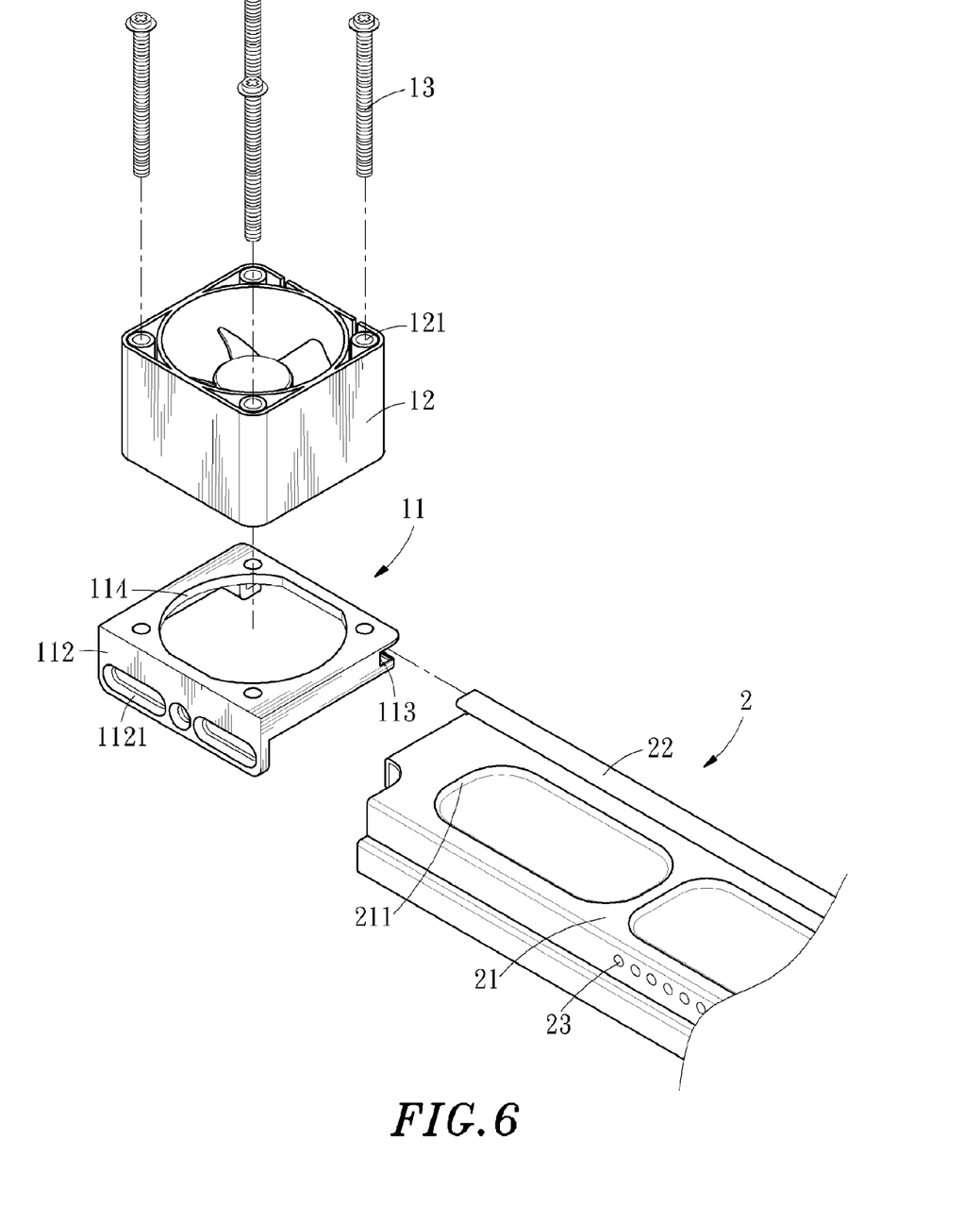
FIG. 6 is an exploded view of an alternate form of the cooler according to the present invention.

FIG. 6 shows an alternate form of the present invention. According to this embodiment, the fan module 1 is comprised or a rack 11 and a fan 12. The rack 11 comprises an opening 114 through at the center, a sliding portion 112 transversely disposed at the front bottom side in flush with the front wall, a sliding groove 113 transversely formed on the back wall near the bottom side, and a plurality of elongated slots 1121 cut through the sliding portion 112 and horizontally aligned in a line. The fan 12 has a plurality of vertically extended mounting through holes 121. Fastening members, for example, screws 13 are respectively mounted in the mounting through holes 121 and threaded into the rack 11 to affix the fan 12 to the rack 11. Same as the aforesaid first embodiment, the fan module 1 can be coupled to the holder frame 2 and moved along the rail 22 to the desired position by means of the sliding portion 112 and the sliding groove 113.

Figure 7:
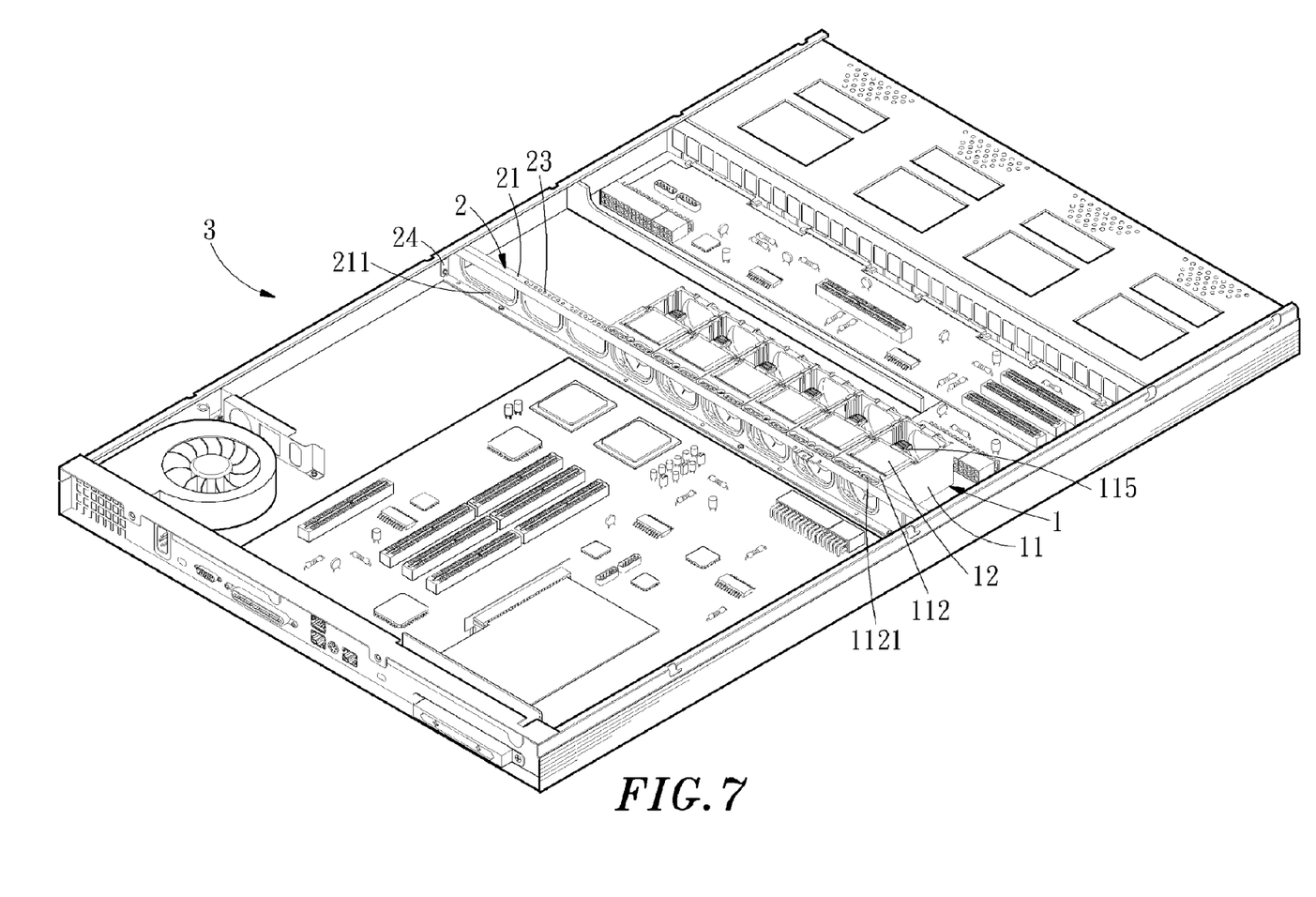
FIG. 7 is an applied view of the present invention, showing the cooler installed in the mainframe of a server.

Referring to FIG. 7, the cooler is mounted inside the mainframe 3 (of a personal computer, server, or industrial host computer). The size of the holder frame 2 is determined subject to the installation space in the mainframe 3. During installation, the end flanges 24 of the holder frame 2 are respectively affixed to the two opposite upright sidewalls of the mainframe 3 with fastening members, and then one or a plurality of fan modules 1 are mounted on the holder frame 2 and affixed thereto at the desired position(s). Each fan module 1 may be provided with one or two fans 12. During operation of the machine (personal computer, server, or industrial host computer), the fans 12 of the fan module(s) 1 are operated to cause currents of air toward heat-releasing computer parts inside the mainframe 3, thereby cooling the temperature of the computer parts efficiently.

As indicated above, the invention uses a holder frame 2 to hold one or a number of fan modules 1. Each fan module 1 has a rack 11 with a sliding portion 112 and a sliding groove 113 for connection to the holder frame 2 allowing the fan module 1 to be moved along the rail 22 of the holder frame 2 to the desired position in vertical alignment with one wind hole 211. When wishing to detach the fan 12 from the rack 111 for a replacement or repair work, the user can directly remove the respective locating plate 115 from the rack 111 with less effort, and then detach the fan 12 from the locating plate 115. After replacement or repair work, the new or well-repaired fan 12 is fastened to the locating plate 115 and then inserted with the locating plate 115 into the rack 11 again.

A prototype of cooler has been constructed with the features of the annexed drawings of FIGS. 1~7. The cooler functions smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A cooler comprising:
   a holder frame connectable to the mainframe of an electronic apparatus, said holder frame comprising a flat elongated frame base, said flat elongated frame base having a first long side, a second long side opposite to said first long side, and a rail extending along said first long side; and
   at least one fan module mounted on said holder frame, said at least one fan module each comprising at least one fan and a rack carrying said at least one fan, said rack comprising a sliding groove transversely provided at a rear side thereof and coupled to the rail of said holder frame for allowing movement of the respective fan module on said holder frame along the rail of said holder frame.

2. The cooler as claimed in claim 1, wherein the rack of each said fan module comprises a sliding portion transversely provided at a front side thereof and attachable to the second long side of said holder frame to guide movement of the respective fan module along the rail of said holder frame.

3. The cooler as claimed in claim 1, wherein the rack of each said fan module comprises a holding chamber for accommodating said at least one fan.

4. The cooler as claimed in claim 3, wherein the rack of each said fan module comprises a plurality of guiding grooves symmetrically transversely provided at two sides inside said holding chamber for the mounting of said at least one fan.

5. The cooler as claimed in claim 4, wherein said at least one fan module each further comprises at least one locating plate insertable into the guiding grooves of said rack to hold one said fan inside said holding chamber, each said locating plate comprising a center opening, two respective said guiding portions symmetrically disposed at two sides and insertable into two respective said guiding grooves at same elevation in the holding chamber of said rack, and a plurality of bottom locating rods downwardly extending from a bottom side thereof for fastening to one said fan.

6. The cooler as claimed in claim 1, wherein the rack of each said fan module comprises an opening at each of top and bottom sides thereof.

7. The cooler as claimed in claim 1, wherein the fan of each said fan module comprises a plurality of mounting through holes for mounting.

8. The cooler as claimed in claim 1, wherein said holder frame further comprises a plurality of wind holes cut through top and bottom sides of said flat elongated frame base.

9. The cooler as claimed in claim 1, wherein said holder frame further comprises a plurality of locating holes horizontally provided at said second long side.

10. The cooler as claimed in claim 1, wherein said holder frame further comprises two end flanges perpendicularly downwardly extending from two distal ends of said frame base.

* * * * *